United States Patent
Agrawal et al.

(10) Patent No.: US 10,720,837 B1
(45) Date of Patent: Jul. 21, 2020

(54) FLY CAPACITOR VOLTAGE BALANCING FOR BUCK CONVERTER CIRCUIT

(71) Applicant: Apple Inc., Cupertino, CA (US)

(72) Inventors: Jitendra K. Agrawal, Fremont, CA (US); Dingkun Du, Santa Clara, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 16/290,799

(22) Filed: Mar. 1, 2019

(51) Int. Cl.
| | |
|---|---|
| H02M 3/158 | (2006.01) |
| H02M 3/157 | (2006.01) |
| G05F 1/46 | (2006.01) |
| G06F 1/26 | (2006.01) |
| H03K 5/24 | (2006.01) |

(52) U.S. Cl.
CPC ............ *H02M 3/158* (2013.01); *G05F 1/462* (2013.01); *G06F 1/26* (2013.01); *H03K 5/24* (2013.01)

(58) Field of Classification Search
CPC ...... H02M 3/156; H02M 3/157; H02M 3/158; H02M 3/1588
See application file for complete search history.

(56) References Cited

U.S. PATENT DOCUMENTS

| | | | | |
|---|---|---|---|---|
| 6,396,250 B1 * | 5/2002 | Bridge | ............... | H02M 3/1588 323/283 |
| 8,212,537 B2 * | 7/2012 | Carpenter | ............ | H02M 3/158 323/222 |
| 8,427,113 B2 | 4/2013 | Xing et al. | | |
| 9,600,062 B2 | 3/2017 | Kumar | | |
| 9,866,113 B1 * | 1/2018 | Assaad | ................... | H02M 3/07 |
| 9,893,632 B2 | 2/2018 | Freeman et al. | | |
| 10,063,145 B1 | 8/2018 | Couleur et al. | | |
| 10,083,947 B2 | 9/2018 | Giuliano | | |
| 2013/0107599 A1 * | 5/2013 | Shekhawat | ........... | H02M 7/487 363/131 |
| 2014/0232364 A1 * | 8/2014 | Thomas | ................ | H02M 7/483 323/271 |
| 2016/0118886 A1 * | 4/2016 | Zhang | ................... | H02M 3/158 323/271 |
| 2016/0190921 A1 * | 6/2016 | Kumar | .................. | H02M 3/158 323/271 |
| 2016/0254746 A1 * | 9/2016 | Lerdworatawee | .... | H02M 3/158 323/271 |
| 2016/0315539 A1 * | 10/2016 | Lee | ........................ | H02M 3/158 |
| 2017/0133842 A1 | 5/2017 | Freeman et al. | | |
| 2018/0115157 A1 * | 4/2018 | Chan | ........................ | H02J 1/00 |
| 2018/0301986 A1 | 10/2018 | Alves et al. | | |
| 2019/0058385 A1 * | 2/2019 | Lazaro | ..................... | H02M 1/08 |

* cited by examiner

*Primary Examiner* — Gary L Laxton
(74) *Attorney, Agent, or Firm* — Kowert, Hood, Munyon, Rankin & Goetzel, P.C.

(57) ABSTRACT

A voltage regulator circuit included in a computer system may include multiple devices and a switch node coupled to a regulated power supply node via an inductor. The voltage regulator circuit may couple the switch node to a capacitor for different periods of time using respective different subsets of the multiple devices. A control circuit may modify active times of control signals coupled to the multiple devices based on voltage samples of the switch node in order to adjust the durations of the different periods of time.

18 Claims, 7 Drawing Sheets

FLY CAPACITOR VOLTAGE BALANCING FOR BUCK CONVERTER CIRCUIT

BACKGROUND

Technical Field

This disclosure relates to power management in computer systems and more particularly to voltage regulator circuit operation.

Description of the Related Art

Modern computer systems may include multiple circuits blocks designed to perform various functions. For example, such circuit blocks may include processors, processor cores configured to executed execute software or program instructions. Additionally, the circuit blocks may include memory circuits, mixed-signal or analog circuits, and the like.

In some computer systems, the circuit blocks may be designed to operate at different power supply voltage levels. Power management circuits may be included in such computer systems to generate and monitor varying power supply voltage levels for the different circuit blocks.

Power management circuits often include one or more power generator circuits configured to generated regulator voltage levels on respective power supply signals using a voltage level of an input power supply signal. Such regulator circuits may employ multiple passive circuit elements, such as inductors, capacitors, and the like.

SUMMARY OF THE EMBODIMENTS

Various embodiments of a method for power monitoring of a computer system are disclosed. Broadly speaking, an apparatus and a method are contemplated, in which a voltage regulator circuit includes a plurality of devices and a switch node couple to a regulated power supply node via an inductor and is configured couple the switch node to a capacitor using a first subset of the plurality of devices during a first time period and couple the switch node to the capacitor using a second, different subset of the plurality of devices during a second time period. A control circuit may be configured to adjust durations of at least one of the first and second time periods by modifying an active time of one or more of control signals coupled to the plurality of devices. The durations may be adjusted based on a comparison of a plurality of voltage samples of the switch node. In one embodiment, to adjust the durations of the at least one of the first and second time periods, the control circuit may be further configured to sample a voltage level of the switch node at a first time point to generate a first voltage level sample, and sample the voltage level of the switch node at a second time point to generate a second voltage level sample.

Figure 1:
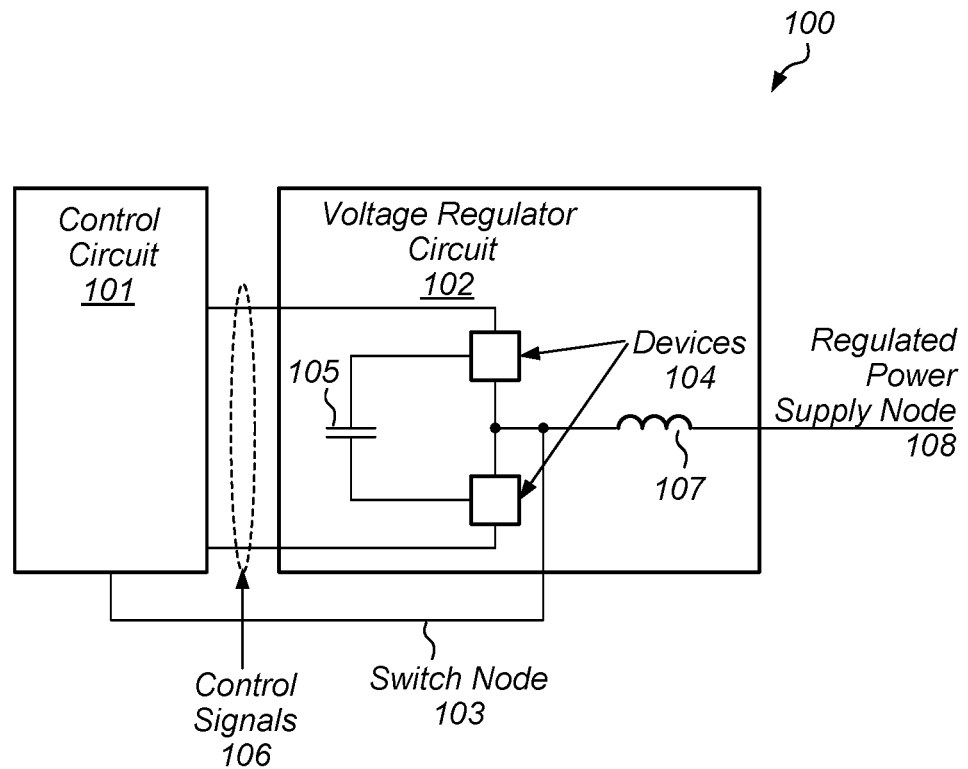
FIG. 1 is a block diagram of an embodiment of a power generator circuit for a computer system.

While the disclosure is susceptible to various modifications and alternative forms, specific embodiments thereof are shown by way of example in the drawings and will herein be described in detail. It should be understood, however, that the drawings and detailed description thereto are not intended to limit the disclosure to the particular form illustrated, but on the contrary, the intention is to cover all modifications, equivalents and alternatives falling within the spirit and scope of the present disclosure as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include," "including," and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. § 112, paragraph (f) interpretation for that unit/circuit/component. More generally, the recitation of any element is expressly intended not to invoke 35 U.S.C. § 112, paragraph (f) interpretation for that element unless the language "means for" or "step for" is specifically recited.

As used herein, the term "based on" is used to describe one or more factors that affect a determination. This term does not foreclose the possibility that additional factors may affect the determination. That is, a determination may be solely based on specified factors or based on the specified factors as well as other, unspecified factors. Consider the phrase "determine A based on B." This phrase specifies that B is a factor that is used to determine A or that affects the determination of A. This phrase does not foreclose that the determination of A may also be based on some other factor, such as C. This phrase is also intended to cover an embodiment in which A is determined based solely on B. The phrase "based on" is thus synonymous with the phrase "based at least in part on."

DETAILED DESCRIPTION OF EMBODIMENTS

Computer systems may include multiple circuit blocks configured to perform specific functions. Such circuit blocks may be fabricated on a common substrate and may employ different power supply voltage levels. Power management units (commonly referred to as "PMUs") may include multiple voltage regulator circuits configured to generate regulated voltage levels for various power supply signals. Such voltage regulator circuits may employ both passive circuit elements (e.g., inductors, capacitors, etc.) as well as active circuit elements (e.g., transistors, diodes, etc.).

Different types of voltage regulator circuits may be employed depending upon power requirements of load circuits, available circuit area, and the like. Such converter circuits include multiple devices and a switch node that is coupled to a regulated power supply node via an inductor. Energy is supplied to the regulator power supply node via the inductor according to a switching sequence. As used herein, a switching sequence refers to an order in which different sets of devices in a voltage regulator circuit are activated in order to couple an inductor included in the voltage regulator circuit to different power supply voltage levels or components at different times.

To reduce transients in the current flowing through the inductor into a load circuit coupled to the voltage regulator circuit, different circuit topologies of voltage regulator circuits may be employed. For example, in some cases, a three-level buck converter circuit topology may be employed to reduce current transients. In a three-level buck converter circuit, rather than connecting the inductor to a power supply node to source current to a load, the energy used to source the current to the load is provided by a capacitor (commonly referred to as a "fly capacitor"), which has been charged to a voltage level less than that of the power supply node. Since the voltage level across the fly capacitor is less that the voltage level of the power supply, voltage stresses across the devices in the buck converter circuit are less, as it the change in the current flowing through the inductor.

If the voltage level across the fly capacitor deviates from a voltage level at or near half of the voltage level of an input power supply to the voltage regulator circuit, series devices in the voltage regulator circuit may experience electrical overstress. Additionally, if the voltage level across the fly capacitor varies from one cycle to the next, the peak current through the inductor may vary from charge cycles to discharge cycles. Such changes in peak current through the inductor can introduce subharmonic ripple currents in the inductor, which can adversely affect the operation of load circuits. The embodiments illustrated in the drawings and described below may provide techniques for balancing, i.e., maintain the voltage level across a voltage regulator circuit fly capacitor at a desired voltage level, in order to provide constant peak currents in the inductor, minimize subharmonic ripple currents in the inductor, and reduce electrical overstress in some devices included in the voltage regulator circuit.

A block diagram of a power generator circuit included in a computer system is illustrated in FIG. 1. As illustrated, power generator circuit 100 includes control circuit 101 and voltage regulator circuit 102. Included in voltage regulator circuit 102 is fly capacitor 105, devices 104 and inductor 107. Devices 104 are coupled to fly capacitor 105 and switch node 103, and are controlled by control signals 106. Inductor 107 is coupled to switch node 103 and regulated power supply node 108.

Voltage regulator circuit 102 is configured to couple switch node 103 to a first terminal of fly capacitor 105 using a first subset of devices 104 during a first time period, and to couple switch node 103 to a second terminal of fly capacitor 105 using a second, different subset of devices 104 during a second time period. As described below, the first and second time periods may correspond to on-times of cycles included in a switching sequence. As used herein, a switching sequence is an ordered sequence of cycles where difference devices are activate for at least part of the duration of each cycle.

Control circuit 101 is configured to adjust durations of at least one of the first and second time periods by modifying an active time of one or more of control signals 106. The durations are adjusted based on a comparison of a plurality of voltage samples of switch node 103. The voltage samples of switch node 103 may be generated during the first and second time periods. As used herein, to adjust the durations of at least one of the first and second time periods includes adjusting either the first time period or the second time period, or adjusting both the first and second time periods.

By adjusting the durations as described above, control circuit 101 may be able to maintain a constant voltage level on switch node 103 during different cycles of operation, thereby maintaining a similar current through inductor 107 from cycle to cycle. For example, in one cycle, the voltage on switch node 103 may be given by $V_{sw1}=V_{in}-V_{cfly}-V_{drp1}$, where $V_{in}$ is the voltage level of an input power supply signal, $V_{cfly}$ is the voltage level across fly capacitor 105, and $V_{drop1}$ is a voltage drop within the regulator circuit during the cycle due to on resistance of devices, parasitic circuit elements, and the like. In another cycle, the voltage on switch node 103 may be given by $V_{sw2}=V_{cfly}-V_{drp2}$, where $V_{drop2}$ is the voltage drop during the other cycle due to on resistance of devices, parasitic circuit elements, and the like. The balancing operation describe below in more detail, results in $V_{sw1}=V_{sw2}$, which results in $V_{cfly}=(V_{in}-V_{drp1}+V_{drp2})/2 \approx V_{in}/2$.

As described above, the desired voltage level across fly capacitor 105 may be substantially the same as half the voltage level of an input power supply signal. By maintaining the voltage across fly capacitor 105 at the desired level, electrical overstress of the components in voltage regulator circuit 102 may be avoided. Additionally, the peak current through inductor 107 may be similar from one cycle to the next, thereby reducing the possibility of subharmonic ripples in the current flowing in inductor 107. The relationship between the on-period (denoted "$T_{ON}$") of the first and second time periods can be expressed as shown in Equation 1, were L is the value of inductor 107, $I_{PK}$ is the peak current through inductor 107, $V_{in}$ is the voltage level of an input power supply signal and $V_{out}$ is the voltage level of regulated power supply node 108. It is noted that Equation 1 is valid for cases where $V_{out}$ is less than $0.5V_{in}$ and that, in other embodiments, different relationships may be employed. For example, in cases where $V_{out}$ is greater than $0.5V_{in}$ an expression for the off-period may be used.

$$T_{ON} = L\left(\frac{I_{PK}}{0.5V_{in} - V_{out}}\right) \qquad (1)$$

Figure 2:
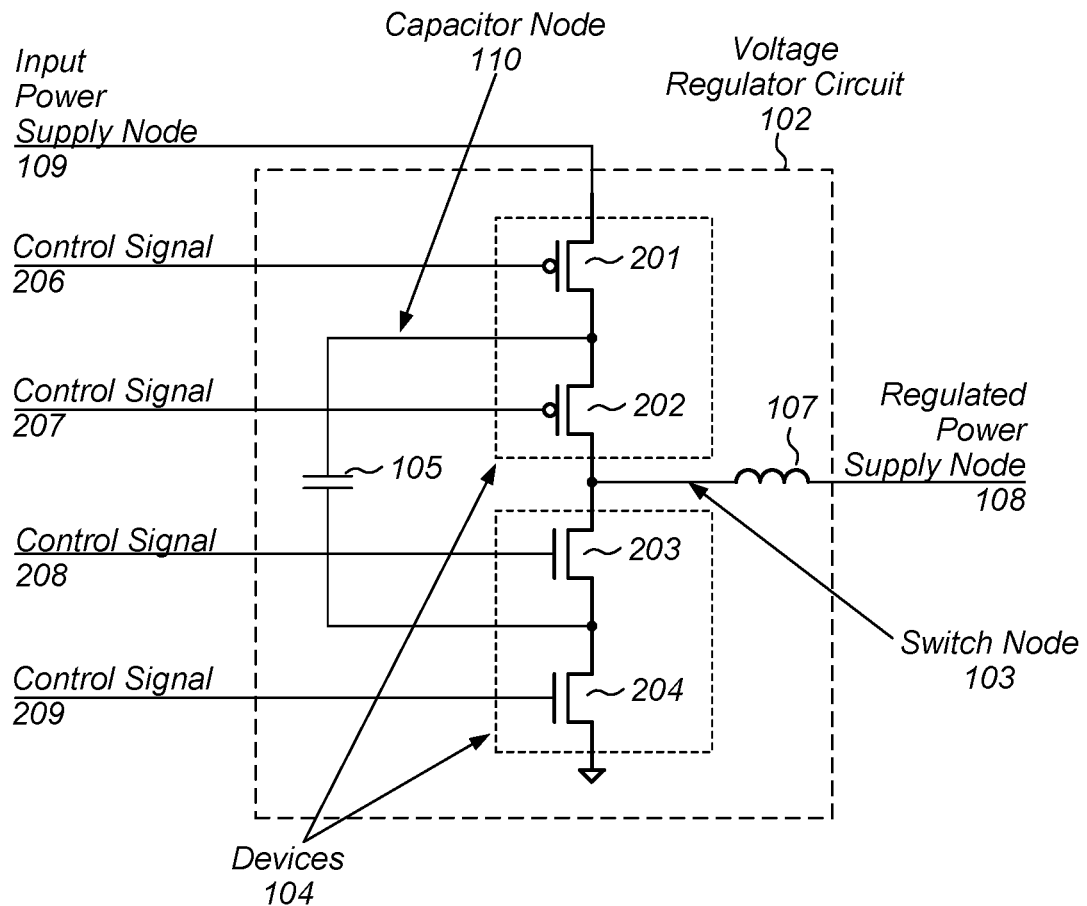
FIG. 2 illustrates a schematic diagram of an embodiment of a voltage regulator circuit.

Voltage regulator circuits, such as voltage regulator circuit 102, may be designed according to one of various design styles. An example of a particular implementation of voltage regulator circuit 102 is depicted in FIG. 2. As illustrated, voltage regulator circuit 102 includes devices 104, inductor 107, and fly capacitor 105.

One terminal of fly capacitor 105 is coupled between devices 201 and 202, and the other terminal of fly capacitor 105 is coupled between devices 203 and 204. In various embodiments, fly capacitor 105 may be located on a same integrated circuit as voltage regulator circuit 102, and may be particular embodiment of a metal-oxide-metal (MOM)

capacitor or any other suitable capacitor structure capable of being manufactured on an integrated circuit as part of a semiconductor manufacturing process. In other cases, fly capacitor 105 may be located on a different integrated circuit, or be a discrete component mounted on a board or other substrate to which an integrated circuit included voltage regulator circuit 102 is also mounted.

In a similar fashion to fly capacitor 105, inductor 107, which is coupled between switch node 103 and regulated power supply node 108, may be fabricated on the same integrated circuit as voltage regulator circuit 102. In other embodiments, inductor 107 may be a discrete component that is co-located on a circuit board or other substrate to which voltage regulator circuit 102 is also mounted Devices 104 include devices 201 through 204. As illustrated, device 201 is coupled to input power supply node 109 and device 202, and is controlled by control signal 206. Device 202 is coupled to device 201 and switch node 103, and is controlled by control signal 207. In a similar fashion, device 203 is coupled between switch node 103 and device 204, while device 204 is coupled between a ground circuit node and device 203. Device 203 is controlled by control signal 208, and device 204 is controlled by control signal 209. In various embodiments, control signals 206-209 are included in control signals 106 as depicted in FIG. 1.

In various embodiments, each of devices 201 through 204 may be particular embodiments of metal-oxide semiconductor field-effect transistors (MOSFETs). For example, devices 201 and 202 may be p-channel MOSFETs, which are activated by low logic levels on control signals 206 and 207, respectively. Devices 203 and 204 may be n-channel MOSFETs, which are activate by high logic levels on control signals 208 and 209, respectively.

During operation, various ones of devices 201-204 may be activated according to one or more switching sequences. As described above, control circuit 101 may determine the duration of the active time for a particular cycle.

In some cases, a four cycle switching sequence is used. During a first cycle, devices 201 and 203 are active for the on-period of the cycle, while devices 202 and 204 are deactivated. With the particular arrangement of activated and deactivated devices, one terminal of fly capacitor 105 is coupled to input power supply node 109 and the other terminal of fly capacitor 105 is coupled to switch node 103, thereby charging fly capacitor 105. For the on-period of the first cycle, fly capacitor 105 will continue to be charged. As described below, at some point during the on-period of the first cycle, the voltage level of switch node 103 will be sampled. Once the on-period of the first cycle has elapsed, devices 201 and 203 will be deactivated for the remaining duration of the first cycle.

Following the first cycle, a second cycle is initiated. During the second cycle, devices 202 and 204 will be activated and devices 201 and 203 will remain deactivated. With devices 202 and 204 activated, one terminal of fly capacitor 105 is coupled to switch node 103, while the other terminal of fly capacitor 105 is coupled to a ground node, thereby discharging fly capacitor 105 into regulated power supply node 108 via inductor 107. As described below, the voltage level of switch node 103 will be sampled at some point during the on-period of the second cycle. In a similar fashion to the first cycle, fly capacitor 105 will continue to be discharged during the on-period of the second cycle. Once the on-period of the second cycle has elapsed, devices 202 and 204 will be deactivated, stopping the discharge of fly capacitor 105. Devices 201-204 will remain deactivated for the remaining duration of the second cycle.

As described below in more detail, the samples of the voltage level of switch node 103 may be compared and the on-periods of the first cycle and the second cycle adjusted based on the comparison of the voltage level samples. By adjusting the on-periods of the cycles, the voltage level across fly capacitor 105 may be maintained at a desired level. In some embodiments, the on-periods for the first and second cycles may be adjusted individually.

Although the operation of two of the four cycles has been described, it is noted that, in some embodiments, device activation in the third cycle is the same as that in the first cycle, and that device activation in the fourth cycle is the same as that in the second cycle. Alternatively, in other embodiments, the third and fourth cycles may have different arrangements of devices activated such that the voltage level across fly capacitor 105 does not change. It is further noted that different switching sequences that include different numbers of cycles, may also be employed.

Figure 3:
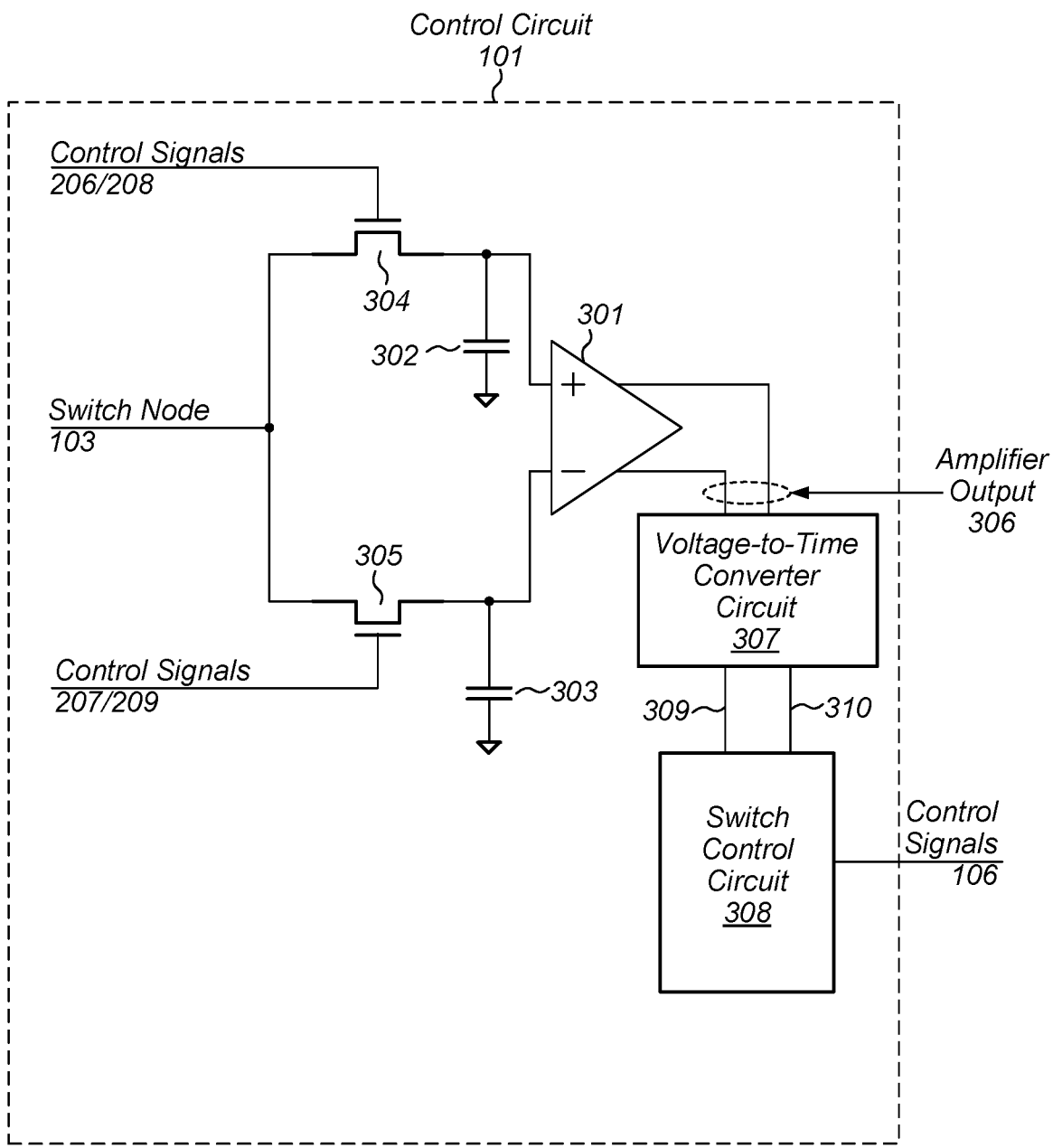
FIG. 3 illustrates a schematic diagram of an embodiment of a control circuit included in a power generator circuit.

As described above, control circuit 101 modifies a duration of the time during which switch node 103 is coupled to fly capacitor 105 based on a comparison of two different samples of the voltage level of switch node 103. A schematic diagram of one possible implementation of control circuit 101 is illustrated in FIG. 3.

As illustrated, control circuit 101 includes linear amplifier 301, sampling capacitors 302 and 303, devices 304 and 305, voltage-to-time converter circuit 307, and switch control circuit 308. A positive input of linear amplifier 301 is coupled to sampling capacitor 302 and device 304, while a negative input of linear amplifier 301 is coupled to sampling capacitor 303 and device 305. Device 304 is also coupled to switch node 103 and is controlled by control signals 206 and 208. Additionally, device 305 is coupled to switch node 103 and is controlled by control signals 207 and 209.

During operation, switch node 103 is coupled to sampling capacitor 302 when device 304 is activated by either control signal 206 or 208. Additionally, when device 305 is activated by either of control signals 207 or 209, switch node 103 is coupled to sampling capacitor 303. When switch node 103 is coupled to either of sampling capacitors 302 or 303, a voltage level of switch node 103, at that time, is stored on a particular one of sampling capacitors 302 and 303. In cases where valley current mode control with adaptive on time control, two different on time reference voltages be generated to main the same peak current through inductor 107. It is noted that the fly capacitor voltage balancing loop does not control the output voltage of power generator circuit 100 and, therefore, has no impact on the stability of the power generator circuit 100.

The sampling of the voltage level of switch node 103 is illustrated with the following example. At a given point in time, device 304 activated, coupled switch node 103 to sampling capacitor 302. The storage of the voltage level of switch node 103 is the result of current flowing from switch node 103 to sampling capacitor 302, or current flowing from sampling capacitor 302 to switch node 103. The direction of current flow is based on a difference between the voltage level of sampling capacitor 302 and the voltage level of switch node 103. Once the voltage level of sampling capacitor 302 has equalized with the voltage level of switch node 103, devices 304 can be deactivated. The voltage level of sampling capacitor 302 will be maintained, less any leakage current, to provide a sample of the voltage level of switch node at the given point in time. Such sample and hold techniques, as described above, may, in various embodiments, provide average filtering as well as a slow loop bandwidth that may promote steady state peak currents through inductor 107.

Each of devices 304 and 305 may be particular embodiments of n-channel MOSFETs. It is noted, however, that in other embodiments, other suitable types of devices, e.g., bipolar devices, may be used to couple sampling capacitors 302 and 303 to switch node 103. Each of sampling capacitors 302 and 303 may be particular embodiments of metal-oxide-metal (MOM) capacitors or any other suitable capacitor structures capable of being manufactured on an integrated circuit as part of a semiconductor manufacturing process. In some cases, sampling capacitors 302 and 303 may be fabricated on a separate integrated circuit from the rest of control circuit 101. Although only two sampling capacitors (and their associated devices) are depicted in the embodiment of FIG. 3, in other embodiments, any suitable number of sampling capacitors may be employed.

Linear amplifier 301 is configured to amplify a difference between a voltage level across sampling capacitor 302 and a voltage level across sampling capacitor 303 to generate amplifier output 306. For example, if the voltage level across sampling capacitor 302 is greater than the voltage level across sampling capacitor 303, then a voltage level of amplifier output 306 may increase. Alternatively, if the voltage level across sampling capacitor 302 is less than the voltage level across sampling capacitor 303, then the voltage level of amplifier output 306 may decrease. It is noted that by using both a differential input and a differential output, linear amplifier 301 may provide good common mode rejection ratio (CMRR) as well as power supply noise rejection.

In various embodiments, the comparison may be made after the time points when sampling capacitors 302 and 303 have been coupled to switch node 103, i.e., when devices 304 and 305 are inactive. In some cases, linear amplifier 301 may be enabled only during the time when the comparison is being performed and deactivated when not in use in order to reduce power consumption. Linear amplifier 301 may be a particular embodiment of a differential amplifier or other suitable circuit configured to generate an output voltage level based on a difference between two or more input voltage levels.

Voltage-to-time converter circuit 307 is configured to generate signals 309 and 310 using amplifier output 306. In various embodiments, voltage-to-time converter circuit 307 may increase or decrease a time difference between signals 309 and 310 based on amplifier output 306. For example, signal 309 may correspond to $T_{on}-\Delta t$ and signal 310 may correspond to $T_{on}+\Delta t$, wherein the value of $\Delta t$ is based on amplifier output 306. In some cases, the greater the value of amplifier output 306, the larger the value of $\Delta t$.

Switch control circuit 308 is configured to generate control signals 106. In various embodiments, switch control circuit 308 may be a particular embodiment of a state machine or other sequential logic circuit and may adjust the active times of various ones of control signals 106 based on signals 309 and 310. In order to adjust the active times of the various ones of control signals 106, switch control circuit 307 may adjust delay values of one or more delay values of multiple delay circuits included in switch control circuit 307. In various embodiments, a give delay circuit of the multiple delay circuits may be configured to delay propagation of a signal, where the amount of time the propagation of the signal is delayed is proportional to a time difference between signals 309 and 310.

Figure 4:
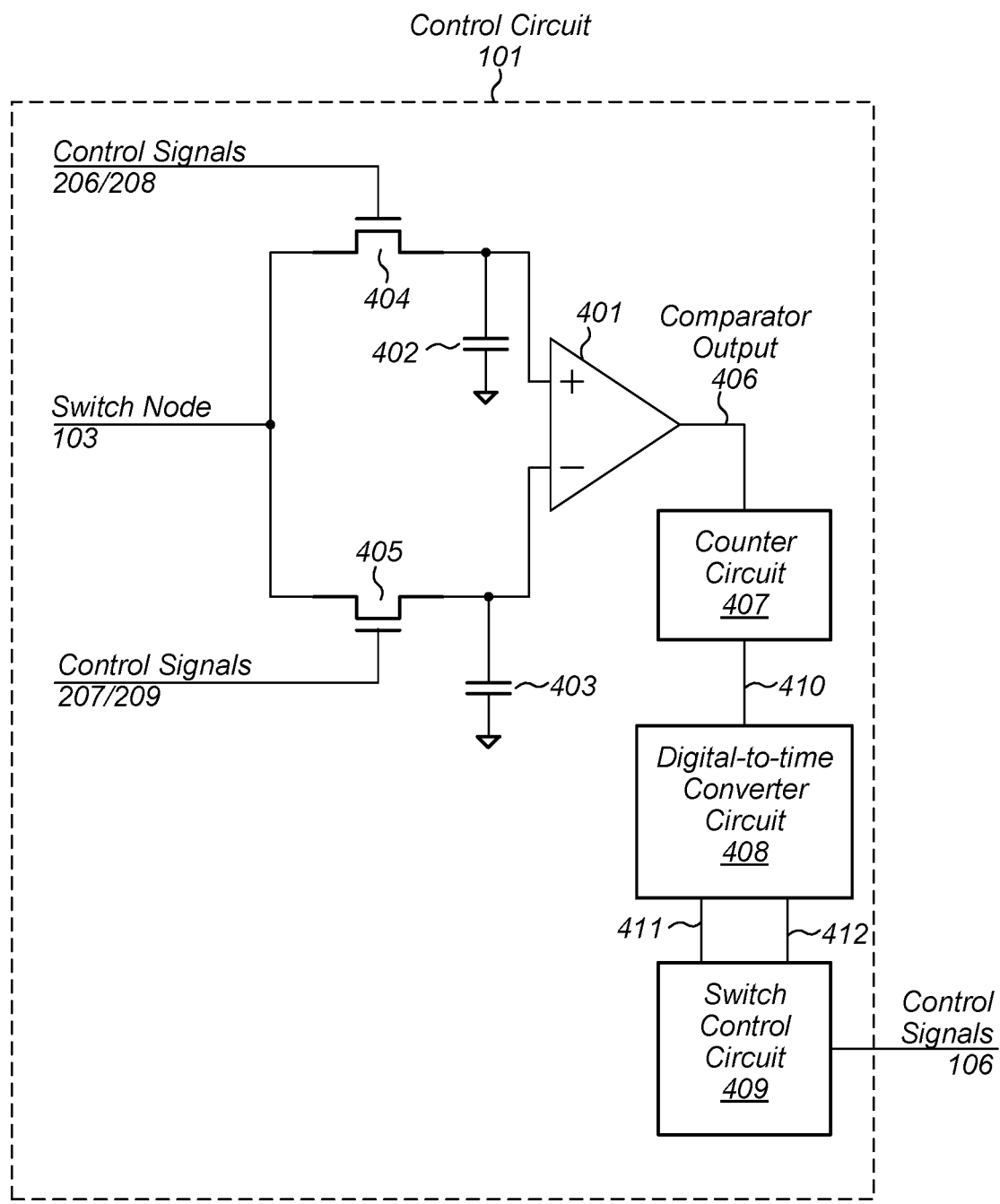
FIG. 4 illustrates a schematic diagram of another embodiment of a control circuit included in a power generator circuit.

The control over the duration of various time periods may be accomplished in different ways. For example, in some cases, counter circuits may be used to control the duration of the time periods that each set of devices are activated. An embodiment of control circuit 101 that employs counter circuits is illustrated in FIG. 4.

As illustrated, control circuit 101 includes comparator 401, sampling capacitors 402 and 403, devices 404 and 405, counter circuit 407, digital-to-time converter circuit 408, and switch control circuit 409. A positive input of comparator 401 is coupled to sampling capacitor 402 and device 404, while a negative input of comparator 401 is coupled to sampling capacitor 403 and device 405. Device 404 is also coupled to switch node 103 and is controlled by control signals 206 and 208. Additionally, device 405 is coupled to switch node 103 and is controlled by control signals 207 and 209. Sampling capacitors 402 and 403 may be fabricated in a similar fashion to sampling capacitors 302 and 303 of the embodiment illustrated in FIG. 3. Similarly, devices 404 and 405 may operate in a similar fashion to devices 304 and 305 of the embodiment of FIG. 3.

Like linear amplifier 301, comparator 401 is configured to compare a voltage level across sampling capacitor 402 to a voltage level across sampling capacitor 403 to generate comparator output 406. Comparator 401, however, may be a particular embodiment of a hysteric comparator, resulting in comparator output 406 being a digital signal as opposed to amplifier output 306 which may be an analog signal. As used herein, a digital signal which transitions between two voltage levels, each of which correspond to a particular logic value. For example, when the voltage level across sampling capacitor 402 is greater than the voltage level across sampling capacitor 403, comparator 401 may cause comparator output 406 to transition to a high logic level. Alternatively, when the voltage level across sampling capacitor 402 is less than the voltage level across sampling capacitor 403, then comparator 401 may cause comparator output 406 to transition to a low logic level.

Counter circuit 407 may be a particular embodiment of a state machine or other sequential logic circuit configured to transition through a set of predetermined states based on a value of comparator output 406 to generate count value 410. For example, a transition from a low logic level to a high logic level on comparator output 406 may cause counter circuit 407 to transition forward one state (commonly referred to as "incrementing"). Alternatively, a transition from a high logic level to a low logic level on comparator output 406 may cause counter circuit 407 to transition backward one state (commonly referred to as "decrementing"). Although a single counter circuit is depicted in the embodiment of FIG. 4, in other embodiments, different numbers of counter circuits may be employed.

Digital-to-time converter circuit 408 is configured to generate signals 411 and 412 using count value 410. In various embodiments, digital-to-time converter circuit 408 may increase or decrease a time difference between signals 411 and 412 based on count value 410. For example, signal 411 may correspond to $T_{on}-\Delta t$ and signal 412 may correspond to $T_{on}+\Delta t$, wherein the value of $\Delta t$ is based on count value 410. In some cases, the greater the value of count value 410, the larger the value of $\Delta t$ Switch control circuit 409 receives signals 411 and 412 from digital-to-time circuit 408 and is configured to adjust active times of one or more of control signals 106 based on signals 411 and 412. In various embodiments, different values of count value 409 may select a different delay circuits included in switch control circuit 407 to adjust the active times of the one or more of control signals 106, or may adjust a digital-to-analog converter (DAC) that is configured to generate the reference on time for the various cycles. By adjusting the active times of various ones of control signals 106, the durations of the time periods different devices are activated are adjusted, thereby maintain the voltage level across a fly capacitor coupled to switch node 103 at a desired voltage level.

Figure 5:
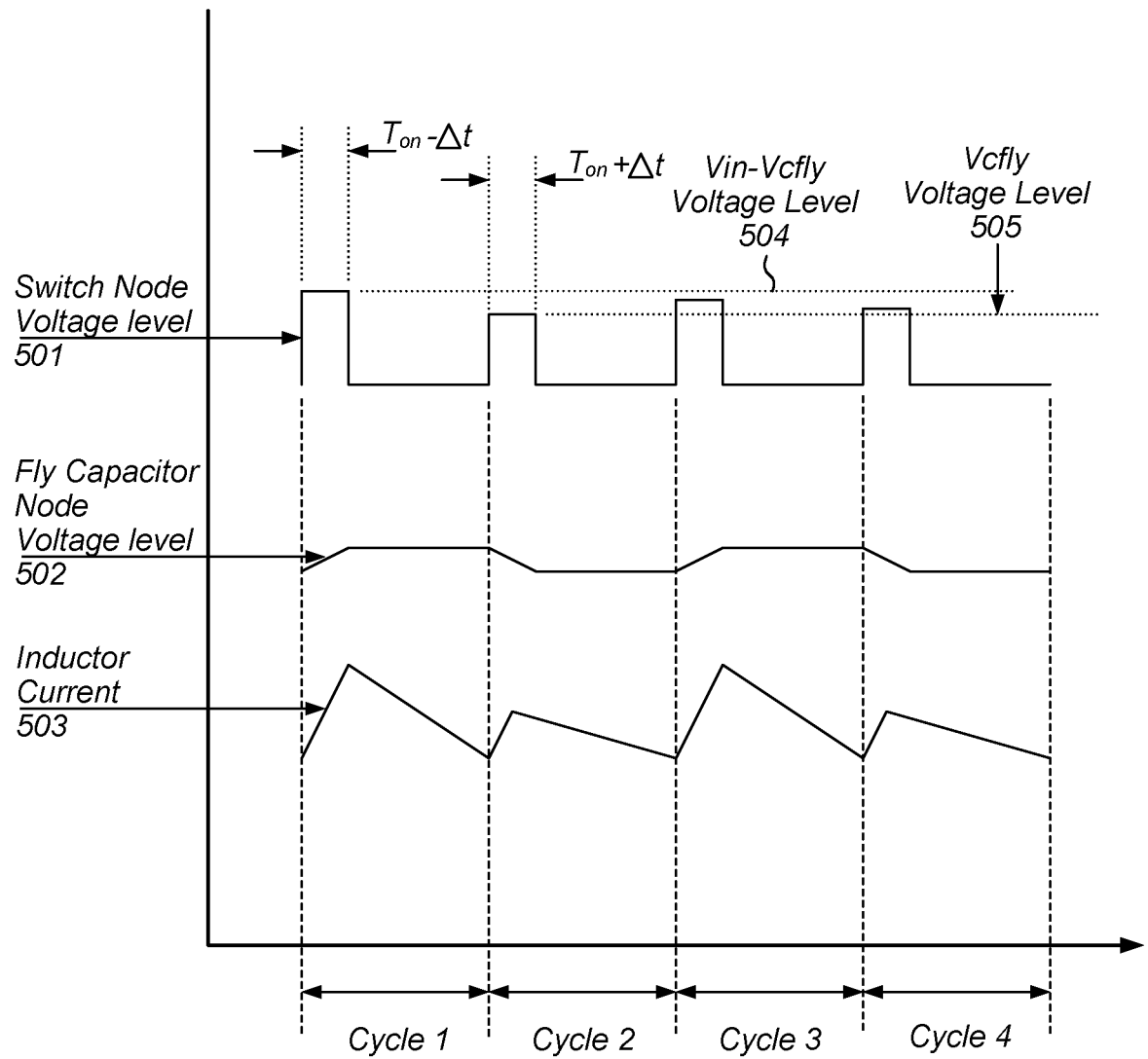
FIG. 5 illustrates example waveforms associated with the operation of a power generator circuit.

Turning to FIG. 5, example waveforms associated with the operation of power generator circuit 100 are illustrated. As illustrated, the waveforms depict switch node voltage level 501, fly capacitor node voltage level 502, and inductor current 503 over four cycles of operation of power generator circuit 100. It is noted that the waveforms are merely examples, and that variations in circuit component values may result in different voltage levels and different behavior in time of the aforementioned waveforms.

As described above, during the active time (also referred to herein as the "on-period") of cycle 1 (denoted by "$T_{on}-\Delta t$"), devices 201 and 203 are active, and devices 202 and 204 are inactive. The activation of devices 201 and 203 couple a first terminal of fly capacitor 105 to input power supply node 109 and a second terminal of fly capacitor 105 to switch node 103. This arrangement results in fly capacitor being charged and the switch node voltage level 501 being set to $V_{in}-V_{cm}$, voltage level 504, where $V_{in}$ is the voltage level on input power supply node 109 and $V_{cfly}$ is the voltage across fly capacitor 105. Also during the active time of cycle 1, inductor current 503 increases. Once $T_{on}-\Delta t$ has expired, inductor current 503 begins to decrease, until the beginning of the next cycle, at which point, inductor current 503 begins to increase again.

During the active time of cycle 2 (again denoted by "$T_{on}+\Delta t$"), devices 201 and 203 are inactive and devices 202 and 204 are active. With devices 202 and 204 active, the first terminal of fly capacitor 105 is coupled to switch node 103, and the second terminal of fly capacitor 105 is coupled to a ground node, thereby discharging fly capacitor 105 through inductor 107. In this configuration, the voltage level of switch node 103 (denoted "switch node voltage level 501") is set to $V_{cfly}$ voltage level 505 for the active time of cycle 2. As fly capacitor 105 is discharged, the voltage level across fly capacitor 105 (denoted by "fly capacitor voltage level 502") decreases until the active time of cycle 2 has ended and devices 202 and 204 are returned to an inactive state.

As described above, control circuit 101 samples the voltage level of switch node 103 at different times. In various embodiments, those times may correspond to the active periods in cycles 1-4. Based on a comparison of the voltage samples, control circuit may adjust the value of $\Delta t$, in order to balance the voltage level across fly capacitor 105. It is noted that the operation during cycle 3 is the same as the operation during cycle 1, and that the operation during cycle 4 is the same as that of cycle 2. In both cycles 3 and 4, however, the difference between the voltage levels of the switch node is less as the switch node voltage levels converge to a single value. Moreover, although only two active times ($T_{on}\pm\Delta t$) is shown in the waveforms of FIG. 5, in other embodiments, cycles 1 and 3 may employ a different active time than cycles 2 and 4. Alternatively, each of cycles 1-4 may employ its own respective active time.

Figure 6:
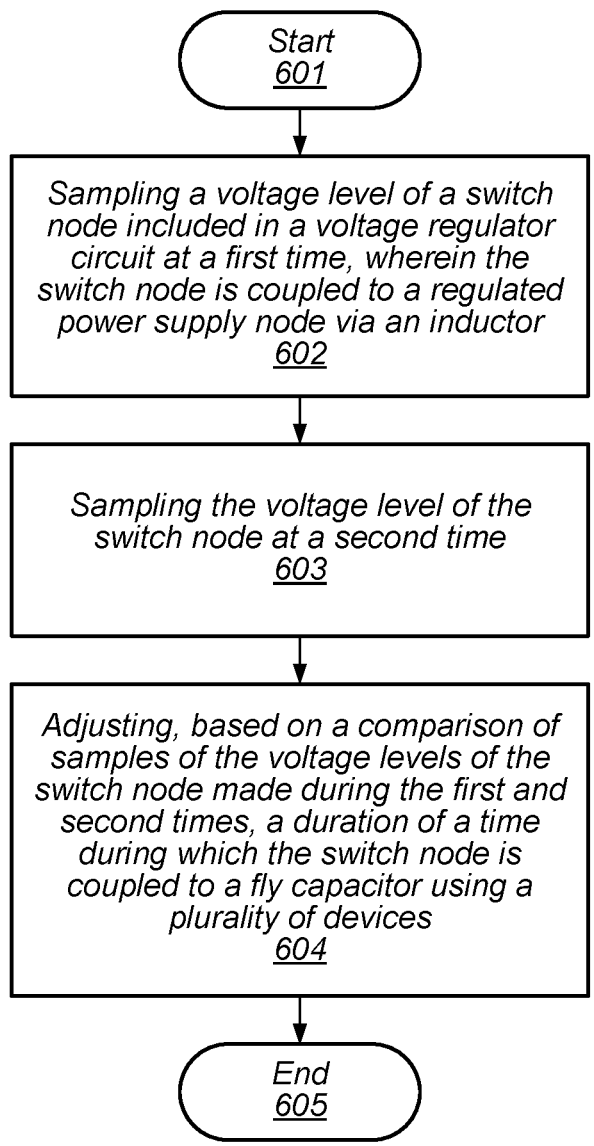
FIG. 6 illustrates a flow diagram depicting an embodiment of a method for balancing the voltage level across a fly capacitor included in a three-level buck converter.

Turning to FIG. 6, a flow diagram depicting an embodiment of a method for balancing the voltage level across a fly capacitor included in a three-level buck converter is illustrated. The method, which may be applied to various three-level buck converter circuits, e.g., voltage regulator circuit 102, begins in block 601.

The method includes sampling a voltage level of a switch node included in a voltage regulator circuit at a first time, wherein the switch node is coupled to a regulated power supply node via an inductor (block 602). In various embodiments, sampling the voltage level of the switch node at the first time includes coupling, starting at the first time, the switch node to a first sampling capacitor for a first period of time.

The method also includes sampling the voltage level of the switch node at a second time (block 603). In some embodiments, sampling the voltage level of the switch node at the second time includes coupling, starting at the second time, the switch node to a second sampling capacitor for a second period of time.

The method further includes adjusting, based on a comparison of samples of the voltage level of the switch node made during the first and second times, a duration of a time during which the switch node is coupled to a fly capacitor using a plurality of devices (block 604). In some cases, adjusting the duration of the time during which the switch node is coupled to the fly capacitor includes changing an active time of at least one of a plurality of control signals coupled to the plurality of devices. It is noted that the active time of the at least one of the plurality of control signals may be an active high or active low time.

As described above, the control circuit may include multiple different sub-circuits. For example, the control circuit may include multiple counter circuits, whose values are used to determine the durations of the first and second time periods. In such cases, the method further includes modifying a count value of a counter circuit based on the comparison of the samples of the voltage level of the switch node. Changing the active time of the at least one of the plurality of control signal may include changing the active time based on the count value of the counter circuit. The method concludes in block 605.

Figure 7:
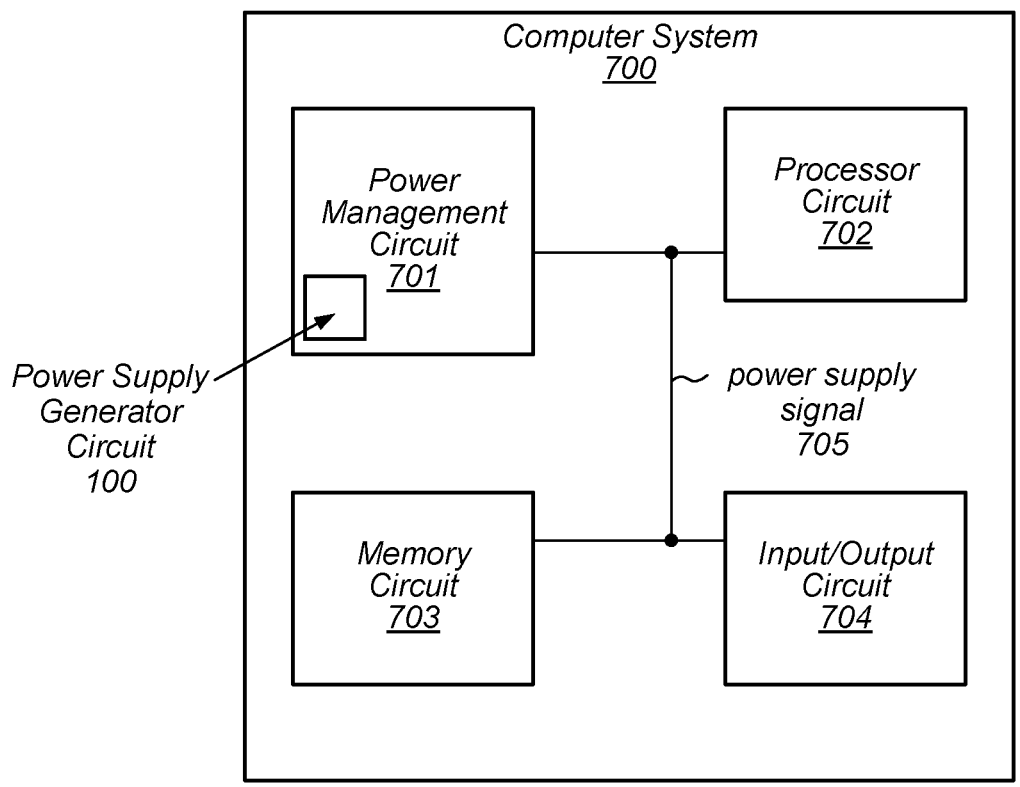
FIG. 7 is a block diagram of one embodiment of a system-on-a-chip that includes a power management circuit.

A block diagram of computer system is illustrated in FIG. 7. In the illustrated embodiment, the computer system 700 includes power management unit 701, processor circuit 702, input/output circuits 704, and memory circuit 703, each of which is coupled to power supply signal 705. In various embodiments, computer system 700 may be a system-on-a-chip (SoC) and/or be configured for use in a desktop computer, server, or in a mobile computing application such as, e.g., a tablet, laptop computer, or wearable computing device.

Power management unit 701 includes power generator circuit 100 which is e configured to generate a regulated voltage level on power supply signal 705 in order to provide power to processor circuit 702, input/output circuits 704, and memory circuit 703. Although power management unit 701 is depicted as including a single power generator circuit, in other embodiments, any suitable number of power generator circuits may be included in power management unit 701, each configured to generate a regulated voltage level on a respective one of multiple power supply signals included in computer system 700.

Processor circuit 702 may, in various embodiments, be representative of a general-purpose processor that performs computational operations. For example, processor circuit 702 may be a central processing unit (CPU) such as a microprocessor, a microcontroller, an application-specific integrated circuit (ASIC), or a field-programmable gate array (FPGA).

Memory circuit 703 may in various embodiments, include any suitable type of memory such as a Dynamic Random-Access Memory (DRAM), a Static Random-Access Memory (SRAM), a Read-Only Memory (ROM), Electrically Erasable Programmable Read-only Memory (EEPROM), or a non-volatile memory, for example. It is noted that although a single memory circuit is depicted in computer system 700 as illustrated in FIG. 7, in other embodiments, any suitable number of memory circuits may be employed.

Input/output circuits 704 may be configured to coordinate data transfer between computer system 700 and one or more peripheral devices. Such peripheral devices may include, without limitation, storage devices (e.g., magnetic or optical media-based storage devices including hard drives, tape drives, CD drives, DVD drives, etc.), audio processing subsystems, or any other suitable type of peripheral devices. In some embodiments, input/output circuits 704 may be configured to implement a version of Universal Serial Bus (USB) protocol or IEEE 1394 (Firewire®) protocol.

Input/output circuits 704 may also be configured to coordinate data transfer between computer system 700 and one or more devices (e.g., other computing systems or integrated circuits) coupled to computer system 700 via a network. In one embodiment, input/output circuits 704 may be configured to perform the data processing necessary to implement an Ethernet (IEEE 802.3) networking standard such as Gigabit Ethernet or 10-Gigabit Ethernet, for example, although it is contemplated that any suitable networking standard may be implemented. In some embodiments, input/output circuits 704 may be configured to implement multiple discrete network interface ports.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a voltage regulator circuit configured to generate a regulated voltage level, wherein the voltage regulator circuit include a plurality of devices and a switch node coupled to a regulated power supply node via an inductor, wherein the voltage regulator circuit is further configured to:
      connect a capacitor between the switch node and an input power supply node using a first subset of the plurality of devices during a first time period; and
      connect the capacitor between the switch node and a ground supply node using a second, different subset of the plurality of devices during a second time period; and
   a control circuit configured to:
      sample a voltage level of the switch node during the first and second time periods to generate first and second voltage samples, respectively;
      amplify respective voltage levels of the first and second voltage samples to generate buffered versions of the first and second voltage samples;
      generate a delay period using a difference between the buffered versions of the first and second voltage samples; and
      adjust, using the delay period, durations of at least one of the first and second time periods.

2. The apparatus of claim 1, wherein the control circuit includes a sampling capacitor, and wherein to sample the voltage level of the switch node at the first time period, the control circuit is further configured to couple the switch node to a sampling capacitor for a given period of time starting at the first time period.

3. The apparatus of claim 1, wherein the control circuit includes amplifier circuit configured to amplify the respective voltage levels of the first and second voltage samples.

4. The apparatus of claim 1, wherein the control circuit includes a plurality of counter circuits, wherein durations of the first and second time periods are based on count values of respective ones of the plurality of counter circuits.

5. The apparatus of claim 1, wherein to connect the capacitor between the switch node and the input power supply node using a first subset of the plurality of devices during the first time period, the control circuit is further configured to charge the capacitor, and wherein to connect the capacitor between the switch node and the ground supply node using a second, different subset of the plurality of devices during the second time period, the control circuit is further configured to discharge the capacitor into the regulated power supply node via the inductor.

6. A method, comprising:
   sampling a voltage level of a switch node included in a voltage regulator circuit at a first time to generate a first sample, wherein the switch node is coupled to a regulated power supply node via an inductor;
   generating, by the voltage regulator circuit, a regulated voltage level on the regulated power supply node;
   sampling the voltage level of the switch node at a second time to generate a second sample;
   amplifying the first sample and the second sample to generate a first buffered sample and a second buffered sample;
   generating a delay period using a difference between the first buffered sample and second buffered sample;
   selectively connecting a fly capacitor to either an input power supply node or a ground node using a plurality of devices; and
   adjusting, using the delay period, a duration of a time during which the switch node is coupled to the fly capacitor using the plurality of devices.

7. The method of claim 6, wherein sampling the voltage level of the switch node in a the voltage regulator circuit at the first time includes sampling the voltage level of the switch node during a period of time when the fly capacitor is being charged, and wherein sampling the voltage level of the switch node at the second time includes sampling the voltage level of the switch node during a period of time when the fly capacitor is being discharged into the regulated power supply node via the inductor.

8. The method of claim 7, wherein adjusting the duration of the time during which the switch node is coupled to the fly capacitor includes modifying an active time of one or more of a plurality of control signals coupled to a plurality of devices that are coupled to the fly capacitor.

9. The method of claim 8, further comprises modifying a count value of a counter circuit based on a comparison of the plurality of samples of the voltage level of the switch node, and wherein modifying the active time of the one or more of the plurality of control signals includes changing the active time based on the count value of the counter circuit.

10. The method of claim 8, wherein sampling the voltage level of the switch node at the first time includes coupling, starting at the first time, the switch node to a first sampling capacitor for a first period of time, and wherein sampling the voltage level of the switch node at the second time includes coupling, starting at the second time, the switch node to a second sampling capacitor for a second period of time.

11. The method of claim 10, wherein amplifying the first sample and the second sample includes amplifying a first voltage level across the first sampling capacitor and a second voltage level across the second sampling capacitor.

12. The method of claim 6, further comprising, connecting the fly capacitor to an input power supply node during a time period other than the during which the switch node is connected to the fly capacitor.

13. An apparatus, comprising:
 a processor circuit coupled to a regulated power supply node; and
 a power generator circuit that includes a plurality of devices, and switch node coupled to the regulated power supply node via an inductor, wherein the power generator circuit is configured to:
  connect a capacitor between the switch node and an input power supply node using a first subset of the plurality of devices during a first time period; and
  connect the capacitor between the switch node and a ground supply node using a second, different subset of the plurality of devices during a second time period;
  sample a voltage level of the switch node at a first time point and a second time point to generate a first and second voltage level samples, respectively;
  amplify respective voltage levels of the first and second voltage level samples to generate buffered versions of the first and second voltage level samples;
  generate a delay period using a difference between the buffered versions of the first and second voltage level samples; and
  adjust, using the delay period, a duration of at least one of the plurality of at least one of the first and second time periods.

14. The apparatus of claim 13, wherein the power generator circuit includes a sampling capacitor, and wherein to sample the voltage level of the switch node at the first time point, the power generator circuit is further configured to couple the switch node to a sampling capacitor for a given period of time starting at the first time point.

15. The apparatus of claim 13, wherein the power generator circuit further includes an amplifier circuit configured to amplify the first voltage level sample and the second voltage level sample.

16. The apparatus of claim 13, wherein the power generator circuit includes a plurality of counter circuits, wherein durations of the first and second time periods are based on count values of respective ones of the one or more counter circuits.

17. The apparatus of claim 13, wherein to connect the capacitor between the switch node and the input power supply node using a first subset of the plurality of devices during the first time period, the power generator circuit is further configured to charge the capacitor, and wherein to connect the capacitor between the switch node and the ground supply node using a second, different subset of the plurality of devices during the second time period, the power generator circuit is further configured to discharge the capacitor into the regulated power supply node via the inductor.

18. The apparatus of claim 17, wherein to charge the capacitor, the power generator circuit is further configured to connect first terminal of the capacitor to an input power supply node.

* * * * *